United States Patent
Ostermann et al.

(10) Patent No.: US 11,169,223 B2
(45) Date of Patent: Nov. 9, 2021

(54) HALL ELEMENT SIGNAL CALIBRATING IN ANGLE SENSOR

(71) Applicant: Allegro MicroSystems, LLC, Manchester, NH (US)

(72) Inventors: Till-Jonas Ostermann, Hirschberg (DE); Dominik Geisler, Heidelberg (DE); Simon Rock, Heidelberg (DE); Fabian Winkler, Heidelberg (DE)

(73) Assignee: Allegro MicroSystems, LLC, Manchester, MA (US)

( * ) Notice: Subject to any disclaimer, the term of this patent is extended or adjusted under 35 U.S.C. 154(b) by 57 days.

(21) Appl. No.: 16/826,451

(22) Filed: Mar. 23, 2020

(65) Prior Publication Data

US 2021/0293904 A1   Sep. 23, 2021

(51) Int. Cl.
*G01R 19/00* (2006.01)
*G01R 33/07* (2006.01)
(Continued)

(52) U.S. Cl.
CPC .............. *G01R 33/07* (2013.01); *G01B 7/30* (2013.01); *G01D 5/145* (2013.01); *G01R 33/0017* (2013.01); *G01R 33/0035* (2013.01)

(58) Field of Classification Search
CPC .............. G01R 33/07; G01R 33/0035; G01R 33/0017; G01R 33/02; G01B 7/30; G01D 5/145
See application file for complete search history.

(56) References Cited

U.S. PATENT DOCUMENTS

| 4,236,832 A | 12/1980 | Komatsu et al. |
| 4,438,347 A | 3/1984 | Gehring |

(Continued)

FOREIGN PATENT DOCUMENTS

| CN | 1501093 A | 6/2004 |
| CN | 2009-86484 Y | 12/2007 |

(Continued)

OTHER PUBLICATIONS

Notice of Allowance dated Nov. 25, 2020 for U.S. Appl. No. 16/160,132; 14 pages.
(Continued)

*Primary Examiner* — Alesa Allgood
(74) *Attorney, Agent, or Firm* — Daly, Crowley, Mofford & Durkee, LLP

(57) ABSTRACT

In one aspect, an angle sensor includes a first Hall element disposed on a first axis, a second Hall element disposed on a second axis perpendicular to the first axis and a conduction path having a first portion extending parallel to the first axis and a second portion parallel to the second axis. The conduction path is configured to conduct a calibration current that generates a first magnetic flux density measured at the first Hall element and a second magnetic flux density measured at the second Hall element. The angle sensor also includes calibration circuitry configured to generate one or more compensation signals based on the first and second magnetic flux densities and to adjust an external magnetic flux density measured at the second Hall element due to an external magnetic field using the one or more compensation signals to reduce angle error of the angle sensor.

33 Claims, 8 Drawing Sheets

(51) Int. Cl.
  *G01R 33/00* (2006.01)
  *G01B 7/30* (2006.01)
  *G01D 5/14* (2006.01)

(56) References Cited

U.S. PATENT DOCUMENTS

| | | | |
|---|---|---|---|
| 4,752,733 A | 6/1988 | Petr et al. | |
| 4,758,943 A | 7/1988 | Aström et al. | |
| 4,760,285 A | 7/1988 | Nelson | |
| 4,823,075 A | 4/1989 | Alley | |
| 4,833,406 A | 5/1989 | Foster | |
| 4,970,411 A | 11/1990 | Halg et al. | |
| 5,247,278 A | 9/1993 | Pant et al. | |
| 5,285,155 A | 2/1994 | Ueda et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,621,319 A | 4/1997 | Bilotti et al. | |
| 5,640,090 A | 6/1997 | Furuya et al. | |
| 5,844,140 A | 12/1998 | Seale | |
| 6,011,770 A | 1/2000 | Tan | |
| 6,351,506 B1 | 2/2002 | Lewicki | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,853,178 B2 | 2/2005 | Hayat-Dawoodi | |
| 6,896,407 B2 | 5/2005 | Nomiyama et al. | |
| 6,917,321 B1 | 7/2005 | Haurie et al. | |
| 6,995,315 B2 | 2/2006 | Sharma et al. | |
| 7,038,448 B2 | 5/2006 | Schott et al. | |
| 7,075,287 B1 | 7/2006 | Mangtani et al. | |
| 7,166,807 B2 | 1/2007 | Gagnon et al. | |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,345,470 B2 | 3/2008 | Suzuki | |
| 7,425,821 B2 | 9/2008 | Monreal et al. | |
| 7,474,093 B2 | 1/2009 | Ausserlechner | |
| 7,476,816 B2 | 1/2009 | Doogue et al. | |
| 7,518,354 B2 | 4/2009 | Stauth et al. | |
| 7,598,601 B2 | 10/2009 | Taylor et al. | |
| 7,605,647 B1 | 10/2009 | Romero et al. | |
| 7,635,993 B2 | 12/2009 | Boeve | |
| 7,694,200 B2 | 4/2010 | Forrest et al. | |
| 7,701,208 B2 | 4/2010 | Nishikawa | |
| 7,709,754 B2 | 5/2010 | Doogue et al. | |
| 7,729,675 B2 | 6/2010 | Krone | |
| 7,746,056 B2 | 6/2010 | Stauth et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,923,996 B2 | 4/2011 | Doogue et al. | |
| 7,936,144 B2 | 5/2011 | Vig et al. | |
| 7,961,823 B2 | 6/2011 | Kolze et al. | |
| 7,990,209 B2 | 8/2011 | Romero | |
| 8,030,918 B2 | 10/2011 | Doogue et al. | |
| 8,080,994 B2 | 12/2011 | Taylor et al. | |
| 8,128,549 B2 | 3/2012 | Testani et al. | |
| 8,134,358 B2 | 3/2012 | Charlier et al. | |
| 8,203,329 B2 | 6/2012 | Hohe et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 8,818,749 B2 | 8/2014 | Friedrich et al. | |
| 8,907,669 B2 | 12/2014 | Petrie | |
| 9,099,638 B2 | 8/2015 | Wang et al. | |
| 9,116,195 B2 | 8/2015 | Yamashita et al. | |
| 9,151,807 B2 | 10/2015 | Friedrich et al. | |
| 9,201,122 B2 | 12/2015 | Cesaretti et al. | |
| 9,606,190 B2 | 3/2017 | Friedrich et al. | |
| 9,645,220 B2 | 5/2017 | Cesaretti et al. | |
| 9,664,494 B2 | 5/2017 | Fernandez et al. | |
| 9,664,752 B2 | 5/2017 | Monreal et al. | |
| 9,804,222 B2 | 10/2017 | Petrie et al. | |
| 9,804,249 B2 | 10/2017 | Petrie et al. | |
| 9,817,078 B2 | 11/2017 | Pepka et al. | |
| 9,841,485 B2 | 12/2017 | Petrie et al. | |
| 9,910,088 B2 | 3/2018 | Milano et al. | |
| 10,073,136 B2 | 9/2018 | Milano et al. | |
| 10,132,879 B2 | 11/2018 | Latham et al. | |
| 10,145,908 B2 | 12/2018 | David et al. | |
| 10,451,671 B2 | 10/2019 | Petrie et al. | |
| 10,466,298 B2 | 11/2019 | Chaware et al. | |
| 10,488,458 B2 | 11/2019 | Milano et al. | |
| 10,495,699 B2 | 12/2019 | Burdette et al. | |
| 2002/0084923 A1 | 7/2002 | Li | |
| 2003/0038675 A1 | 2/2003 | Gailus et al. | |
| 2003/0102909 A1 | 6/2003 | Motz | |
| 2003/0151406 A1 | 8/2003 | Wan et al. | |
| 2005/0253578 A1* | 11/2005 | Kawashima | G01D 5/24419 324/207.25 |
| 2005/0258820 A1 | 11/2005 | Forster | |
| 2006/0164080 A1 | 7/2006 | Popovic et al. | |
| 2006/0202692 A1 | 9/2006 | Tatschl et al. | |
| 2006/0253746 A1 | 11/2006 | Momtaz | |
| 2007/0110199 A1 | 5/2007 | Momtaz et al. | |
| 2007/0247141 A1 | 10/2007 | Pastre et al. | |
| 2007/0285089 A1 | 12/2007 | Ibuki et al. | |
| 2008/0094055 A1 | 4/2008 | Monreal et al. | |
| 2008/0110987 A1 | 5/2008 | Cato et al. | |
| 2008/0137784 A1 | 6/2008 | Krone | |
| 2008/0238410 A1 | 10/2008 | Charlier et al. | |
| 2008/0265880 A1 | 10/2008 | Nishikawa | |
| 2009/0001964 A1 | 1/2009 | Strzalkowski | |
| 2009/0001972 A1 | 1/2009 | Fernandez et al. | |
| 2009/0085706 A1 | 4/2009 | Baarman et al. | |
| 2009/0256559 A1* | 10/2009 | Ausserlechner | G01R 33/066 324/251 |
| 2010/0321105 A1 | 12/2010 | Romero | |
| 2011/0031960 A1 | 2/2011 | Hohe et al. | |
| 2011/0048102 A1 | 3/2011 | Fernandez et al. | |
| 2011/0074405 A1 | 3/2011 | Doogue et al. | |
| 2011/0119015 A1 | 5/2011 | Hirobe et al. | |
| 2011/0298448 A1 | 12/2011 | Foletto et al. | |
| 2011/0304325 A1 | 12/2011 | Walther et al. | |
| 2012/0016614 A1 | 1/2012 | Hohe et al. | |
| 2012/0016625 A1 | 1/2012 | Hernandez-Oliver et al. | |
| 2012/0086442 A1 | 4/2012 | Haas et al. | |
| 2012/0217960 A1 | 8/2012 | Ausserlechner | |
| 2012/0274314 A1 | 11/2012 | Cesaretti et al. | |
| 2013/0057256 A1 | 3/2013 | Ernst et al. | |
| 2013/0057276 A1 | 3/2013 | Klein | |
| 2013/0093412 A1 | 4/2013 | Anelli et al. | |
| 2014/0184214 A1* | 7/2014 | Schaffer | G01R 33/0041 324/253 |
| 2014/0210023 A1 | 7/2014 | Wang | |
| 2015/0008913 A1 | 1/2015 | Fu et al. | |
| 2015/0022192 A1 | 1/2015 | Ausserlechner | |
| 2015/0207061 A1* | 7/2015 | Ausserlechner | G01D 5/145 257/421 |
| 2015/0345990 A1 | 12/2015 | David et al. | |
| 2015/0346289 A1* | 12/2015 | Ausserlechner | G01R 33/0005 324/251 |
| 2015/0354985 A1 | 12/2015 | Judkins, III et al. | |
| 2016/0139229 A1 | 5/2016 | Petrie et al. | |
| 2017/0016965 A1 | 1/2017 | Chaware et al. | |
| 2017/0123036 A1* | 5/2017 | Miyake | G01R 19/0092 |
| 2018/0011150 A1 | 1/2018 | Pepka et al. | |
| 2018/0313912 A1 | 11/2018 | David et al. | |
| 2018/0340911 A1 | 11/2018 | Romero | |
| 2018/0340989 A1 | 11/2018 | Latham et al. | |
| 2019/0049530 A1 | 2/2019 | Latham et al. | |
| 2019/0113592 A1 | 4/2019 | Rigoni et al. | |
| 2020/0049760 A1 | 2/2020 | Milano et al. | |

(56) References Cited

U.S. PATENT DOCUMENTS

| | | |
|---|---|---|
| 2020/0057097 A1 | 2/2020 | Vuillermet et al. |
| 2020/0096576 A1 | 3/2020 | Rossi et al. |
| 2020/0393529 A1* | 12/2020 | Larson .............. G01R 33/0035 |

FOREIGN PATENT DOCUMENTS

| | | |
|---|---|---|
| DE | 195 39 458 A1 | 4/1997 |
| DE | 196 06 826 A1 | 8/1997 |
| DE | 10 2004 017 191 A1 | 10/2005 |
| DE | 10 2005 047 413 A1 | 9/2006 |
| DE | 10 2006 037 226 A1 | 2/2008 |
| DE | 10 2007 041 230 B3 | 4/2009 |
| EP | 0 289 414 A2 | 11/1988 |
| EP | 0 289 414 A3 | 11/1988 |
| EP | 0 338 122 A1 | 10/1989 |
| EP | 0 357 013 A2 | 3/1990 |
| EP | 0 357 013 A3 | 3/1990 |
| EP | 1 637 898 A1 | 3/2006 |
| EP | 1 679 524 A1 | 7/2006 |
| EP | 1 850 143 A1 | 10/2007 |
| GB | 919207 A | 2/1963 |
| GB | 2 276 727 A | 10/1994 |
| JP | S 63-11675 Y2 | 4/1988 |
| JP | 03-248611 | 11/1991 |
| JP | H 06-148777 | 5/1994 |
| JP | 2000-0055999 | 2/2000 |
| JP | 2002-213992 | 7/2002 |
| JP | 2004-177228 | 6/2004 |
| JP | 2004-234589 | 8/2004 |
| JP | 2006-123012 A | 5/2006 |
| JP | 2006-126012 | 5/2006 |
| JP | 2008-513762 | 5/2008 |
| JP | 2011-052036 A | 3/2011 |
| KR | 10-2007-0060096 | 6/2007 |
| WO | WO 9602849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2010/097677 A1 | 9/2010 |
| WO | WO 2011/011479 A1 | 1/2011 |
| WO | WO 2016/077065 A1 | 5/2016 |
| WO | WO 2016/077066 A1 | 5/2016 |

OTHER PUBLICATIONS

Response to U.S. Final Office Action dated Aug. 6, 2020 for U.S. Appl. No. 16/160,132; Response filed on Oct. 28, 2020; 7 pages.
U.S. Non-Final Office Action dated Jun. 11, 2020 for U.S. Appl. No. 16/160,132; 27 Pages.
U.S. Final Office Action dated Aug. 6, 2020 for U.S. Appl. No. 16/160,132; 18 Pages.
Response to U.S. Non-Final Office Action dated Jun. 11, 2020 for U.S. Appl. No. 16/160,132; Response filed on Jul. 15, 2020; 9 Pages.
Written Submission Pursuant to Official Hearing filed on Nov. 6, 2020 for Indian Application No. 2318/KOLNP/2010; 59 pages.
U.S. Appl. No. 17/218,315, filed Mar. 31, 2021, Rubinsztain et al.
Allegro MicroSystems, LLC, "Chopper-Stabilized Precision Hall-Effect Switch with Advanced Diagnostics;" A1160 Data Sheet, Rev. 3; Feb. 4, 2020; 13 Pages.
Allegro MicroSystems, LLC, "Programmable Linear Hall IC with Advanced Diagnostics for Safety-Critical Applications;" A1342 Data Sheet, Rev. 2; Jan. 25, 2019; 48 Pages.
Allegro MicroSystems, LLC, "Programmable Linear Hall IC with Advanced Diagnostics for Safety-Critical Applications;" A1346 Data Sheet, Rev. 5; Dec. 16, 2019; 52 Pages.
Extended European Search Report dated Apr. 29, 2021 for EP Application No. 20206805.2-1010; 7 pages.

U.S. Appl. No. 16/254,874, filed Jan. 23, 2019, Weiland et al.
U.S. Appl. No. 16/683,800, filed Nov. 14, 2019, David et al.
Allegro MicroSystems, LLC, "Programmable Linear Hall with Advanced Diagnostics;" A1342 Preliminary Design Intent Datasheet; Revision 2.0 JJL; 44 Pages.
Ausserlechner et al., "Compensation of the Piezo-Hall Effect in Integrated Hall Sensors on (100)-Si;" IEEE Sensors Journal, vol. 7, No. 11; Nov. 2007; pp. 1475-1482; 8 Pages.
Ausserlechner et al., "Drift of Magnetic Sensitivity of Smart Hall Sensors Due to Moisture Absorbed by the IC-Package;" Proceedings of IEEE Sensors Conference, vol. 1; Oct. 24, 2004; pp. 455-458; 4 Pages.
Ausserlechner, "Limits of Offset Cancellation by the Principle of Spinning Current Hall Probe;" Proceedings of IEEE Sensors Conference; Oct. 24, 2004; pp. 1117-1120; 4 Pages.
Ausserlechner, "The piezo-Hall effect in n-silicon for arbitrary crystal orientation;" Proceedings of IEEE Sensors Conference, vol. 3; Oct. 24, 2004; pp. 1149-1152; 4 Pages.
Bahreyni et al., "A Resonant Micromachined Magnetic Field Sensor;" IEEE Sensors Journal, vol. 7, No. 9, Sep. 2007; pp. 1326-1334; 9 Pages.
Barrettino et al., "CMOS-Based Monolithic Controllers for Smart Sensors Comprising Micromembranes and Microcantilevers;" IEEE Transactions on Circuits and Systems-1: Regular Papers, vol. 54, No. 1; Jan. 2007; pp. 141-152; 12 Pages.
Baschirotto et al., "Development and Analysis of a PCB Vector 2-D Magnetic Field Sensor System for Electronic Compasses;" IEEE Sensors Journal, vol. 6, No. 2; Apr. 2006; pp. 365-371; 7 Pages.
Bilotti et al., "Monolithic Magnetic Hall Sensor Using Dynamic Quadrature Offset Cancellation;" Technical Paper STP 97-10: Product Description; IEEE Journal of Solid-State Circuits;, vol. 32, Issue 6; Jun. 1997; pp. 829-836; 8 Pages.
Blagojevic et al.; "FD SOI Hall Sensor Electronics Interfaces for Energy Measurement;" Microelectronics Journal 37; Sep. 2006; pp. 1576-1583; 8 Pages.
Cesaretti et al., "Effect of Stress Due to Plastic Package Moisture Absorption in Hall Sensors;" IEEE Transactions on Magnetics, vol. 45, No. 16; Oct. 2009; pp. 4482-4485; 4 Pages.
Demierre et al., "Reference Magnetic Actuator for Self-Calibration of a Very Small Hall Sensor Array;" Sensors and Actuators A 97-98; Apr. 2002; pp. 39-46; 8 Pages.
Frick et al., "CMOS Microsystem for AC Current Measurement with Galvanic Isolation;" IEEE Sensors Journal, vol. 3, No. 6; Dec. 2003; pp. 752-760; 9 Pages.
Halg, "Piezo-Hall Coefficients of n-Type Silicon;" Journal of Applied Physics, vol. 64, No. 1; Jul. 1, 1988; pp. 276-282; 7 Pages.
Hosticka, "CMOS Sensor Systems;" Sensors and Actuators A 66; Apr. 1998; pp. 335-341; 7 Pages.
Kanda et al., "The Piezo-Hall Effect in n-Silicon;" Proceedings of the $22^{nd}$ International Conference on the Physics of Semiconductors, vol. 1; Jan. 1995; pp. 89-92; 4 Pages.
Kayal et al.; "Automatic Calibration of Hall Sensor Microsystems;" Microelectronics Journal 37; Sep. 2006; pp. 1569-1575; 7 Pages.
Krammerer et al., "A Hall effect sensors network insensitive to mechanical stress;" Proceedings of IEEE Sensors, vol. 3; Oct. 2004; pp. 1071-1074; 4 Pages.
Magnani et al., "Mechanical Stress Measurement Electronics Based on Piezo-Resistive and Piezo-Hall Effects;" Proceedings of the $9^{th}$ International Conference on Electronics, Circuits and Systems, vol. 1; Dec. 2002; pp. 363-366; 4 Pages.
Manic et al., "Short and Long-Term Stability Problems of Hall Plates in Plastic Packages;" IEEE $38^{th}$ Annual International Reliability Physics Symposium; Apr. 2000; pp. 225-230; 6 Pages.
Manic, "Drift in Silicon Integrated Sensors and Circuits Due to the Thermo-Mechanical Stresses;" Lausanne, École Polytechnique Fédérale De Lausanne 2000; Part 1 of 2; 74 Pages.
Manic, "Drift in Silicon Integrated Sensors and Circuits Due to the Thermo-Mechanical Stresses;" Lausanne, École Polytechnique Fédérale De Lausanne 2000; Part 2 of 2; 102 Pages.
Motz et al., "A Chopped Hall Sensor with Small Jitter and Programmable "True Power-On" Function;" IEEE Journal of Solid-State Circuits, vol. 40, No. 7; Jul. 2005; pp. 1533-1540; 8 Pages.

(56) References Cited

OTHER PUBLICATIONS

Motz et al., "An Integrated Hall Sensor Platform Design for Position, Angle and Current Sensing;" IEEE Sensors 2006; Oct. 22-25, 2006; pp. 1008-1011; 4 Pages.

Motz et al., "An Integrated Magnetic Sensor with Two Continuous-Time ΔΣ-Converters and Stress Compensation Capability;" IEEE International Solid-State Circuits Conference; Digest of Technical Papers; Feb. 6, 2006; pp. 1151-1160; 7 Pages.

Munter, "A Low-offset Spinning-current Hall Plate;" Sensors and Actuators A21-A23; Jan. 1990; pp. 743-746; 4 Pages.

Munter, "Electronic Circuitry for a Smart Spinning-current Hall Plate with Low Offset;" Sensors and Actuators A 25-27; Jun. 1991; pp. 747-751; 5 Pages.

Partin et al., "Temperature Stable Hall Effect Sensors;" IEEE Sensors Journal, vol. 6, No. 1; Feb. 2006; pp. 106-110; 5 Pages.

Pastre et al., "A Hall Sensor Analog Front End for Current Measurement with Continuous Gain Calibration;" IEEE Sensors Journal, vol. 7, No. 5; May 2007; pp. 860-867; 8 Pages.

Pastre et al., "A Hall Sensor-Based Current Measurement Microsystem With Continuous Gain Calibration;" Proceedings of IEEE Research in Microelectronics and Electronics, vol. 2; Jul. 25, 2005; pp. 95-98; 4 Pages.

Popovic, "Sensor Microsystems;" Proceedings of the $20^{th}$ International Conference on Microelectronics (MIEL 95), vol. 2; Sep. 12-14, 1995; pp. 531-537; 7 Pages.

Randhawa, "Monolithic Integrated Hall Devices in Silicon Circuits;" Microelectronics Journal, vol. 12, No. 6; Sep. 14-17, 1981; pp. 24-29; 6 Pages.

Ruther et al., "Integrated CMOS-Based Sensor Array for Mechanical Stress Mapping;" $5^{th}$ IEEE Sensors Conference; Oct. 22-25, 2007; pp. 1131-1134; 4 Pages.

Ruther et al., "Thermomagnetic Residual Offset in Integrated Hall Plates;" IEEE Sensors Journal, vol. 3, No. 6; Dec. 2003; pp. 693-699; 7 Pages.

Sargent; "Switched-capacitor IC controls feedback loop;" EDN; Design Ideas; Feb. 17, 2000; pp. 154 and 156; 2 Pages.

Schneider et al., "Temperature Calibration of CMOS Magnetic Vector Probe for Contactless Angle Measurement System;" Proceedings of the 1996 IEEE; Jan. 1996; pp. 533-536; 4 Pages.

Schott et al., "CMOS Single-Chip Electronic Compass with Microcontroller;" IEEE Journal of Solid-State Circuits, vol. 42, No. 12; Dec. 2007; pp. 2923-2933; 11 Pages.

Schott et al., "Linearizing Integrated Hall Devices;" International Conference on Solid-State Sensors and Actuators (Transducers '97); Jun. 16-19, 1997; pp. 393-396; 4 Pages.

Simon et al., "Autocalibration of Silicon Hall Devices;" $8^{th}$ International Conference on Solid-State Sensors and Actuators, and Eurosensors IX (Transducers '95—Eurosensors IX), vol. 2; Jun. 25-29, 1995; pp. 237-240; 4 Pages.

Steiner et al., "Offset Reduction in Hall Devices by Continuous Spinning Current Method;" Sensors and Actuators A 66; Jan. 1998; pp. 167-172; 6 Pages.

Steiner et al., "Double-Hall Sensor with Self-Compensated Offset;" International Electron Devices Meeting (IEDM); Dec. 7, 1997; pp. 911-914; 4 Pages.

Stellrecht et al., "Characterization of Hygroscopic Swelling Behavior of Mold Compounds and Plastic Packages;" IEEE Transactions on Components and Packaging Technologies, vol. 27, No. 3; Sep. 2004; pp. 499-506; 8 Pages.

Tian et al., "Multiple Sensors on Pulsed Eddy-Current Detection for 3-D Subsurface Crack Assessment;" IEEE Sensors Journal, vol. 5, No. 1; Feb. 2005; pp. 90-96; 7 Pages.

Trontelj et al., "CMOS Integrated Magnetic Field Source Used as a Reference in Magnetic Field Sensors on Common Substrate;" Proceedings of IMTC Conference; May 10-12, 1994; pp. 461-463; 3 Pages.

Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324; 3 Pages.

Zou et al., "Three-Dimensional Die Surface Stress Measurements in Delaminated and Non-Delaminated Plastic Packages;" 48th Electronic Components and Technology Conference; May 25, 1998; pp. 1223-1234; 12 Pages.

U.S. Non-Final Office Action dated Nov. 17, 2017 for U.S. Appl. No. 15/161,553; 16 pages.

Response to U.S. Non-Final Office Action dated Nov. 17, 2017 for U.S. Appl. No. 15/161,553; Response filed Feb. 9, 2018; 10 pages.

U.S. Final Office Action dated Mar. 22, 2018 for U.S. Appl. No. 15/161,553; 14 pages.

Response to U.S. Final Office Action dated Mar. 22, 2018 for U.S. Appl. No. 15/161,553; Response filed Jun. 19, 2018; 10 pages.

Notice of Allowance dated Aug. 13, 2018 for U.S. Appl. No. 15/161,553; 15 pages.

PCT Invitation to pay fees and Partial Search Report dated Jul. 10, 2017 for PCT Application No. PCT/US2017/029588, 15 pages.

PCT International Search Report and Written Opinion dated Oct. 4, 2017 for PCT Application No. PCT/US2017/029588; 23 pages.

PCT International Preliminary Report on Patentability dated Dec. 6, 2018 for International Application No. PCT/US2017/029588; 15 Pages.

Communication Pursuant to Rules 161(1) and 162 EPC dated Dec. 12, 2018 for European Application No. 17722302.1; 3 Pages.

Office Action dated Jun. 30, 2010 for U.S. Appl. No. 12/037,393; 21 Pages.

Response to Office Action dated Jun. 30, 2010 for U.S. Appl. No. 12/037,393; Response filed on Oct. 14, 2010; 34 Pages.

$1^{st}$ Notice of Allowance dated Nov. 3, 2010 for U.S. Appl. No. 12/037,393; 7 Pages.

$2^{nd}$ Notice of Allowance dated Feb. 11, 2011 for U.S. Appl. No. 12/037,393; 8 Pages.

Office Action dated Feb. 2, 2011 for U.S. Appl. No. 12/959,672; 13 Pages.

Response to Office Action dated Feb. 2, 2011 for U.S. Appl. No. 12/959,672; Response filed on May 24, 2011; 8 Pages.

Notice of Allowance dated Jun. 27, 2011 for U.S. Appl. No. 12/959,672; 8 Pages.

Second Notice of Allowance dated Jul. 19, 2011 for U.S. Appl. No. 12/959,672; 8 Pages.

PCT International Search Report and Written Opinion dated Oct. 23, 2009 for International Application No. PCT/US2009/031776; 16 Pages.

PCT International Preliminary Report dated Sep. 10, 2010 for International Application No. PCT/US2009/031776; 10 Pages.

Japanese $1^{st}$ Office Action (English Translation Only) dated Apr. 4, 2013 corresponding to Japanese Application No. 2010-547666; 4 Pages.

Response (w/Reporting Letter) to $1^{st}$ Japanese Office Action dated Apr. 4, 2013 corresponding to Japanese Application No. 2010-547666; Response filed on Jul. 3, 2013; 8 Pages.

Japanese $2^{nd}$ Office Action (English Translation Only) dated Nov. 28, 2013 corresponding to Japanese Application No. 2010-547666; 2 Pages.

Response (w/Reporting Letter) to Japanese $2^{nd}$ Office Action dated Nov. 28, 2013 corresponding to Japanese Application No. 2010-547666; Response filed on Feb. 28, 2014; 12 Pages.

Japanese $3^{rd}$ Office Action (w/English Translation) dated Sep. 29, 2014 corresponding to Japanese Application No. 2010-547666; 8 Pages.

Response (w/Reporting Letter) to Japanese $3^{rd}$ Office Action dated Sep. 29, 2014 corresponding to Japanese Application No. 2010-547666; Response filed on Jan. 27, 2015; 6 Pages.

Japanese Notice of Allowance (w/Reporting Letter & Allowed Claims in English) dated May 25, 2015 corresponding to Japanese Application No. 2010-547666; 9 Pages.

Translation of Current Claims on file (as amended on Aug. 29, 2016) for JP 2015-013206; 2 pages.

Letter from Japanese Associate dated Sep. 27, 2016 indicating Notice of Appeal filed in Japan and enclosing a copy of Current Claims dated Aug. 29, 2016; for Japanese Patent Application No. 2015-013206; 3 pages.

English Translation of Report of Re-Examination before Appeal dated Nov. 28, 2016 for JP Appl. No. 2015-013206; 3 pages.

(56) References Cited

OTHER PUBLICATIONS

Letter from Yuasa and Hara dated Dec. 14, 2016 regarding Appeal for JP Pat Appl. No. 2015-013206; 3 pages.
Letter to Yuasa and Hara dated Feb. 17, 2017 for Japanese Pat. Application No. 2015-013206; 3 pages.
Allowed claims filed on Jun. 5, 2017 for Japanese Pat. Application No. 2015-013206; 2 pages.
Korean Office Action (with English Translation) dated Sep. 30, 2013 corresponding to Korean Application No. 10-2010-7019498; 10 Pages.
Response (w/English Translation) to Korean Office Action dated Sep. 30, 2013 corresponding to Korean Application No. 10-2010-7019498; Response filed on Dec. 1, 2014; 32 Pages.
Korean Notice of Allowance (w/English Translation) dated Apr. 20, 2015 corresponding to Korean Application No. 10-2010-7019498; 3 Pages.
Korean Office Action (w/English Translation) dated Jan. 30, 2015 corresponding to Korean Application No. 10-2014-7033792; 6 Pages.
Response (w/English Translation) to Korean Office Action dated Jan. 30, 2015 corresponding to Korean Application No. 10-2014-7033792; Response filed on Mar. 23, 2015; 11 Pages.
Korean Notice of Allowance (w/English Translation) dated Jul. 31, 2015 corresponding to Korean Application No. 10-2014-7033792; 5 Pages.
Government of India, Patent Office Examination Report dated Mar. 6, 2017; 8 pages.
Response to the First Examination Report filed on Sep. 6, 2017 for Indian Pat. Appl. No. 2318/KOLNP/2010; 37 pages.
Letter from Shardul Amarchand Mangaldas dated Sep. 15, 2017 for Indian Pat. Appl. No. 2318/KOLNP/2010; 1 page.
Office Action dated Sep. 10, 2019 for German Application No. 112009000448.2 with English Translation; 23 Pages.
Response to German Office Action with English machine translation dated Jan. 17, 2020 for German Application No. 112009000448.2; 26 pages.
Chinese Office Action (w/English Translation) dated Aug. 29, 2012 corresponding to Chinese Application No. 200980106535.4; 8 Pages.
Response (w/Reporting Letter) to Chinese Office Action dated Aug. 29, 2012 corresponding to Chinese Application No. 200980106535.4; Response filed on Jan. 19, 2013; 13 Pages.
Chinese $2^{nd}$ Office Action (w/English Translation) dated Apr. 15, 2013 corresponding to Chinese Application No. 200980106535.4; 9 Pages.
Response (w/Reporting Letter) to Chinese $2^{nd}$ Office Action dated Apr. 15, 2013 corresponding to Chinese Application No. 200980106535.4; Response filed on Jun. 27, 2013; 13 Pages.
Chinese $3^{rd}$ Office Action (w/English Translation) dated Nov. 7, 2013 corresponding to Chinese Application No. 200980106535.4; 9 Pages.
Response (w/Reporting Letter) to Chinese $3^{rd}$ Office Action dated November/, 2013 corresponding to Chinese Application No. 200980106535.4; Response filed on Jan. 1, 2014; 11 Pages.
Chinese Notice of Allowance (w/English Translation) dated Mar. 7, 2014 corresponding to Chinese Application No. 200980106535.4; 8 Pages.
PCT International Search Report and Written Opinion dated Aug. 11, 2010 for International Application No. PCT/US2010/024256; 14 Pages.
PCT International Preliminary Report dated Sep. 1, 2011 for International Application No. PCT/US2010/024256; 9 Pages.
German Office Action (with English Translation) dated Sep. 23, 2013 for German Application No. 112010000848.5; 12 Pages.
Response (with Amended English Claims & Reporting Letter from FA) to German Office Action dated Sep. 23, 2013 for German Application No. 112010000848.5; Response filed May 26, 2014; 50 Pages.
U.S. Non-Final Office Action dated Jul. 6, 2012 for U.S. Appl. No. 12/706,318; 29 Pages.

Response to U.S. Non-Final Office Action dated Jul. 6, 2012 for U.S. Appl. No. 12/706,318; Response filed Sep. 27, 2012; 12 Pages.
Supplemental Response to U.S. Non-Final Office Action dated Jul. 6, 2012 for U.S. Appl. No. 12/706,318; Response filed Oct. 2, 2012; 12 pages.
U.S. Notice of Allowance; dated Dec. 10, 2012; for U.S. Appl. No. 12/706,318; 9 pages.
U.S. Non-Final Office Action dated Jun. 12, 2013 for U.S. Appl. No. 13/743,451; 24 pages.
Response to U.S. Non-Final Office Action dated Jun. 12, 2013 for U.S. Appl. No. 13/743,451; Response filed Oct. 8, 2013; 12 pages.
U.S. Notice of Allowance dated Dec. 24, 2013 for U.S. Appl. No. 13/743,451; 24 pages.
312 Amendment filed Feb. 11, 2014 for U.S. Appl. No. 13/743,451; 7 Pages.
Response to Rule 312 Amendment dated Mar. 21, 2013 for U.S. Appl. No. 13/743,451; 2 Pages.
Preliminary Amendment dated Mar. 7, 2012 for U.S. Appl. No. 12/840,324; 7 pages.
U.S. Non-Final Office Action dated Sep. 11, 2012; U.S. Appl. No. 12/840,324; 17 pages.
Response to U.S. Non-Final Office Action dated Sep. 11, 2012 for U.S. Appl. No. 12/840,324; Response filed Dec. 11, 2012; 15 pages.
U.S. Final Office Action dated Feb. 12, 2013 for U.S. Appl. No. 12/840,324; 19 pages.
Response to U.S. Final Office Action dated Feb. 12, 2013 for U.S. Appl. No. 12/840,324; Response filed May 13, 2013; 12 pages.
U.S. Notice of Allowance dated May 24, 2013 for U.S. Appl. No. 12/840,324; 12 pages.
PCT International Search Report and Written Opinion dated Sep. 27, 2010 for International Application No. PCT/US2010/042694; 16 Pages.
PCT International Preliminary Report of the ISA dated Feb. 2, 2012 for International Application No. PCT/US2010/042694; 11 Pages.
European Rule 161/162 Communication dated Feb. 23, 2012 for European Appl. No. 10739429.8; 2 Pages.
Response to European Rule 161/162 Communication dated Feb. 23, 2012 and Written Opinion for European Appl. No. 10739429.8; Response filed Sep. 4, 2012; 11 Pages.
European Intention to Grant dated Jan. 4, 2013 for European Pat. Appl. No. 10 739 429.8; 5 Pages.
Extended European Search Report dated Jul. 4, 2013 for EP Pat. Appl. No. 13169661.9; 11 pages.
Response to Extended European Search Report dated Jul. 4, 2013 for EP Pat. Appl. No. 13169661.9; Response filed Mar. 4, 2014; 18 pages.
European Intention to Grant dated Aug. 14, 2014 for EP Pat. Appl. No. 13169661.9; 5 pages.
Voluntary Amendment (with English Translation and FA Reporting Letter) filed Jun. 12, 2013 for Japanese Application No. 2012-521746; 11 Pages.
Japanese Office Action (with English Translation) dated Mar. 4, 2014 for Japanese Application No. 2012-521746; 4 Pages.
Response (with Machine English Translation) to Japanese Office Action dated Mar. 4, 2014 for Japanese Application No. 2012-521746; Response filed Jul. 3, 2014; 8 Pages.
Japanese Decision to Grant (with Machine English Translation) dated Aug. 19, 2014 for Japanese Application No. 2012-521746; 4 Pages.
Korean Voluntary Amendment (with Machine English Translation) filed Apr. 17, 2015 for Korean Application No. 10-2012-7004427; 6 Pages.
Korean Office Action (with English Translation) dated May 17, 2016 for Korean Application No. 10-2012-7004427; 19 Pages.
Response to Korean Office Action (with Machine English Translation) dated May 17, 2016 for Korean Application No. 10-2012-7004427; Response filed Jul. 15, 2016; 54 Pages.
Korean Notice of Allowance (with English Translation) dated Sep. 22, 2016 for Korean Application No. 10-2012-7004427; 3 Pages.
U.S. Non-Final Office Action dated Jun. 11, 2020 for U.S. Appl. No. 16/160,132; 14 pages.
U.S. Non-Final Office Action dated Jan. 9, 2015 for U.S. Appl. No. 14/321,347; 6 Pages.

(56) References Cited

OTHER PUBLICATIONS

Response to U.S. Non-Final Office Action dated Jan. 9, 2015 for U.S. Appl. No. 14/321,347; Response filed Apr. 29, 2015; 9 Pages.
U.S. Notice of Allowance dated Jun. 1, 2015 for U.S. Appl. No. 14/321,347; 10 Pages.
German Decision to Grant (with Reporting Letter from FA dated Dec. 20, 2017) dated Dec. 14, 2017 for German Application No. 112010000848.5; 9 Pages.
U.S. Notice of Allowance dated Nov. 14, 2013 for U.S. Appl. No. 13/969,702; 12 pages.
Notice of Hearing dated Sep. 17, 2020 For Indian Application No. 2318/KOLNP/2010; 3 pages.
Intention to Grant dated May 28, 2020 for European Application No. 17722302.1; 7 pages.

* cited by examiner

HALL ELEMENT SIGNAL CALIBRATING IN ANGLE SENSOR

BACKGROUND

Typically, a magnetic-field angle sensor measures a direction of a magnetic-field vector through 360° in an x-y plane. In one example, a magnetic-field angle sensor may be used to detect an angular position of a rotating magnet. Some magnetic-field angle sensors may include one or more Hall elements. When signals from Hall elements are not properly calibrated, angle error of the angle sensor increases. Generally, the angle error is defined to be the difference between an actual position of a magnet and a position of the magnet as measured by the angle sensor.

SUMMARY

In one aspect, an angle sensor includes a first Hall element disposed on a first axis, a second Hall element disposed on a second axis perpendicular to the first axis and a conduction path having a first portion extending parallel to the first axis and a second portion parallel to the second axis. The conduction path is configured to conduct a calibration current that generates a first magnetic flux density measured at the first Hall element and a second magnetic flux density measured at the second Hall element. The angle sensor also includes calibration circuitry configured to generate one or more compensation signals based on the first and second magnetic flux densities and to adjust an external magnetic flux density measured at the second Hall element due to an external magnetic field using the one or more compensation signals to reduce angle error of the angle sensor.

In another aspect, a method includes determining one or more compensation signals based on a first magnetic flux density measured at a first Hall element of an angle sensor disposed on a first axis and a second magnetic flux density measured at a second Hall element of the angle sensor disposed on a second axis perpendicular to the first axis and adjusting an external magnetic flux density measured at the second Hall element due to an external magnetic field using the one or more compensation signals.

In a further aspect, an angle sensor includes a first Hall element disposed on a first axis, a second Hall element disposed on a second axis perpendicular to the first axis, a first conduction path extending parallel to the first axis, a second conduction path extending parallel to the second axis, and calibration circuitry configured to generate one or more compensation signals based on the first and second magnetic flux densities and adjust an external magnetic flux density measured at the second Hall element due to an external magnetic field using the one or more compensation signals to reduce angle error of the angle sensor. The first conduction path is configured to conduct a first calibration current that generates a first magnetic flux density measured at the first Hall and the second conduction path is configured to conduct a second calibration current that generates a second magnetic flux density measured at the second Hall element.

In a still further aspect, an angle sensor includes a first Hall element disposed on a first axis; a second Hall element disposed on a second axis perpendicular to the first axis and a means for calibrating signals from the first and second Hall elements.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to improve angle accuracy of a magnetic-field angle sensor (e.g., on an integrated circuit (IC)) by calibrating signals, on the IC, from Hall elements used in an angle sensor as opposed to a one-time calibration done at an IC manufacturer.

Figure 1:
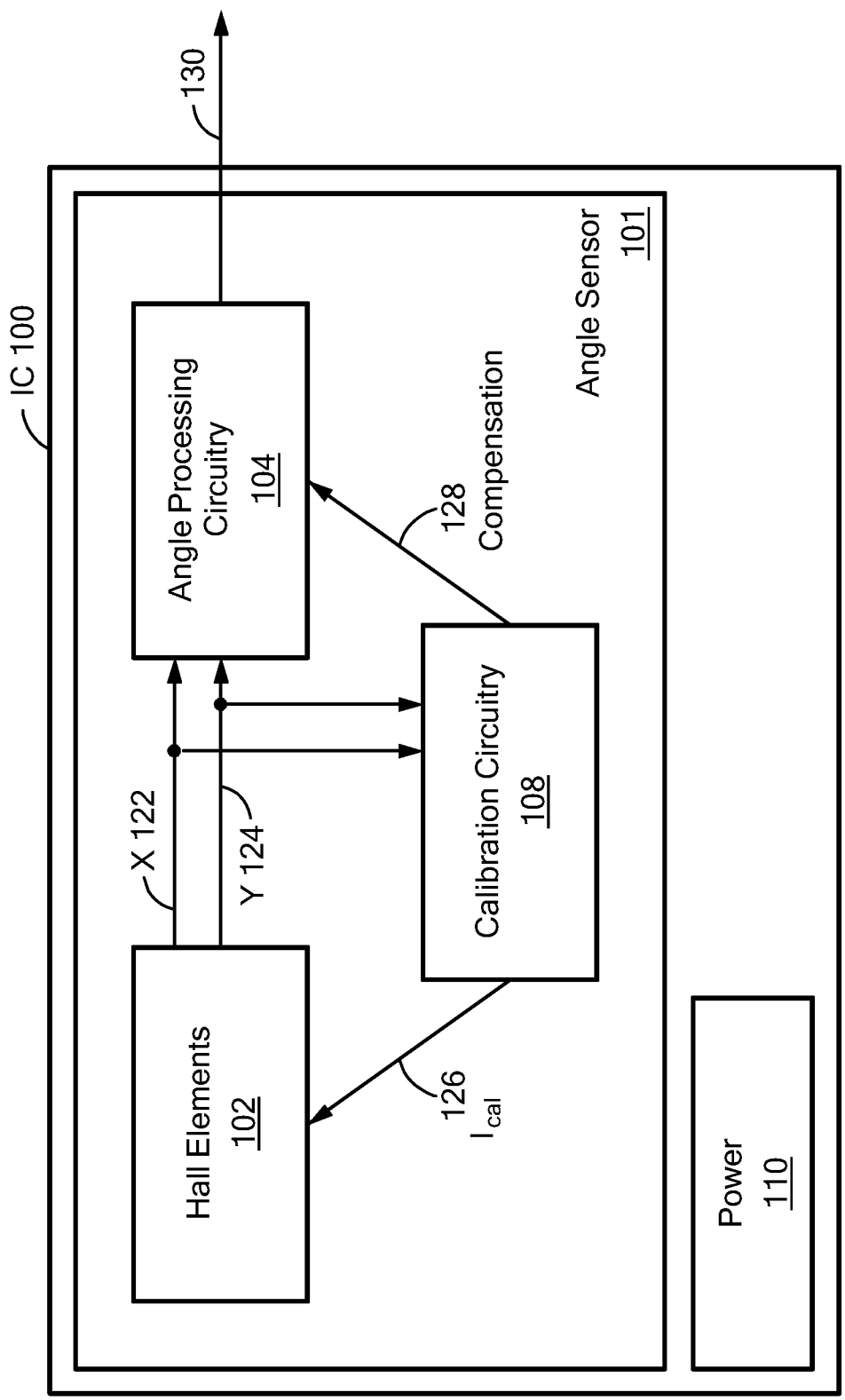
FIG. 1 is a block diagram of an example of an integrated circuit (IC) to calibrate signals from Hall elements.

Referring to FIG. 1, an example of an IC that performs calibration of signals from Hall element is an IC 100. The IC 100 includes an angle sensor 101 and power 110 that power components on the IC 100 including the angle sensor 101. The angle sensor 101 includes Hall elements 102, angle processing circuitry 104 and calibration circuitry 108.

In one example, the Hall elements 101 are planar Hall elements. In another example, the Hall elements 101 are vertical Hall elements.

The Hall elements 102 in this embodiment include at least two Hall elements that are orthogonal to each other and the angle sensor 101 is a 2D (two-dimensional) angle sensor. For example, at least one Hall element is along an x-axis and at least one Hall element is along a y-axis.

In other embodiments, the Hall elements 102 may include at least three Hall elements that are orthogonal to each other and the angle sensor 101 is a 3D (three-dimensional) angle sensor. For example, at least one Hall element is along an x-axis, at least one Hall element is along a y-axis and at least one Hall element is along a z-axis.

In one example, the Hall elements 102 provide a signal X 122 from at least one Hall element along the x-axis and a signal Y 122 from at least one Hall element along the y-axis. The signals X 122, Y 124 are sent to the angle processing circuitry 104 and to the calibration circuitry 108.

In one example, in a first mode, the calibration circuitry 108 provides a calibration current $I_{cal}$ 126 used in calibrating signals from the Hall elements 102. The calibration current $I_{cal}$ 126 is used to measure the sensitivity of the Hall elements 101. In particular, the calibration current $I_{cal}$ 126 generates a magnetic flux density that is detected by the Hall elements 102. The signals X 122, Y 124, which are provided by the Hall elements 102, are used by the calibration circuitry 108 to generate one or more compensation signals 128. In one example, the calibration current $I_{cal}$ 126 is an alternating current. In one example, a frequency of the calibration current $I_{cal}$ 126 is 100 kHz.

In a second mode, without the calibration current $I_{cal}$ activated, the Hall elements 102 detect a magnetic field and provide the signals X 122, Y 124. The angle circuitry 104 uses the compensation signals 128 to calibrate one or more of the signals X 122, Y 124. Based on the signals X 122, Y 124 and the compensation signals 128, the angle circuitry 104 provides an output signal 130 that includes an angle.

Figure 2A:
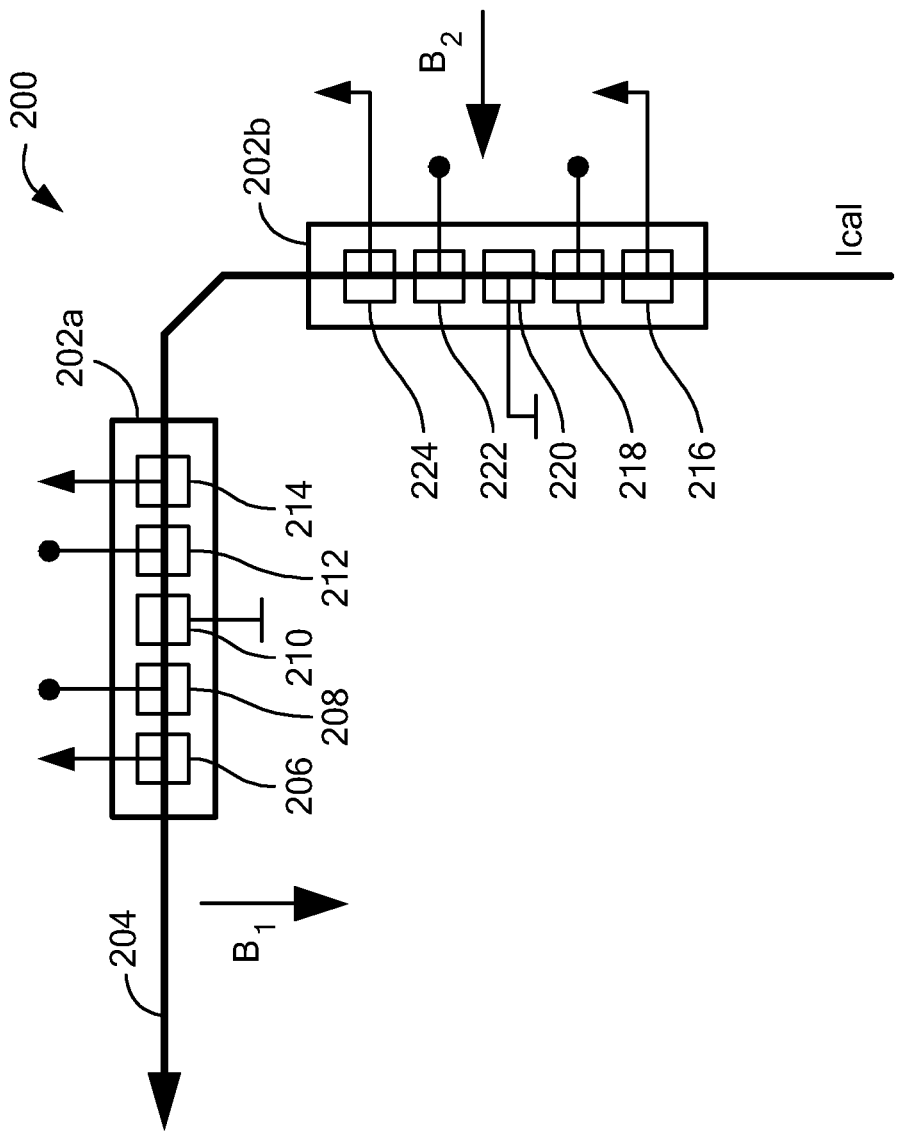
FIGS. 2A and 2B are diagrams of vertical Hall elements with a conduction path used to generate magnetic field flux densities.
Figure 2B:
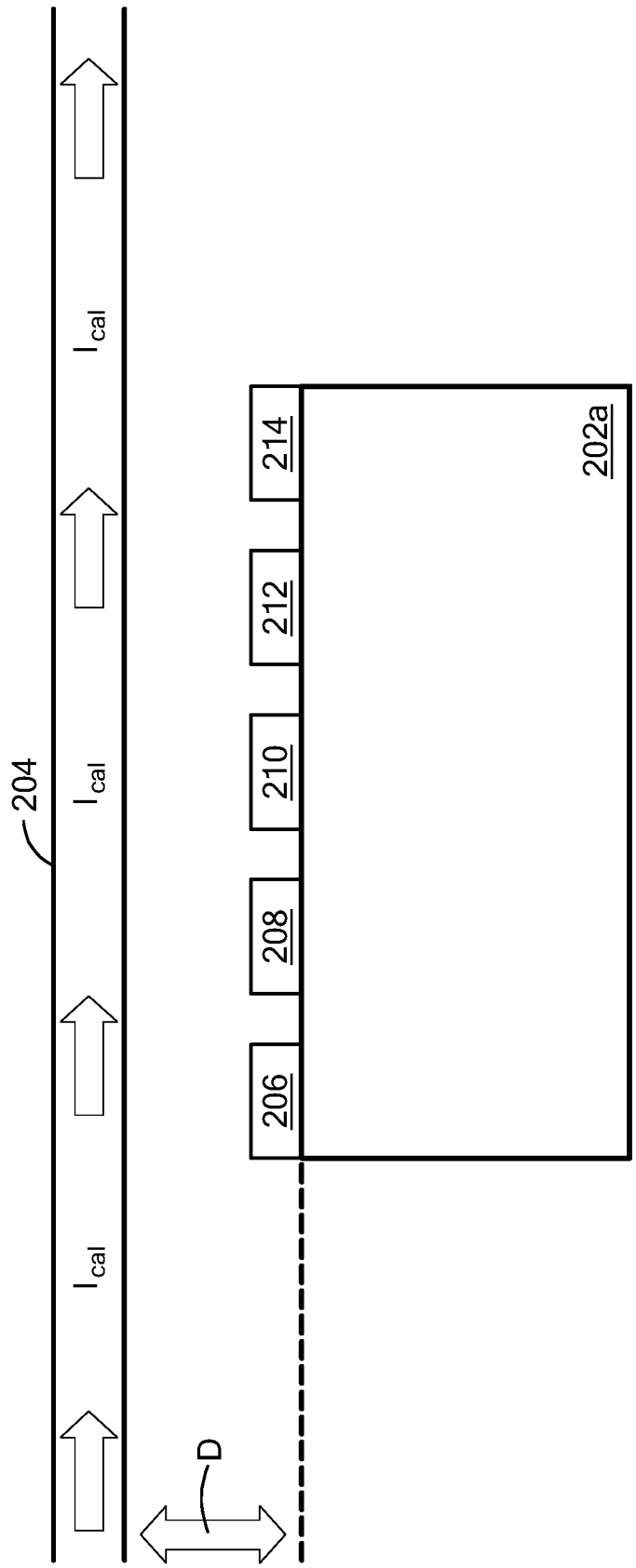

Referring to FIGS. 2A and 2B, an example of a circuit configuration used to generate magnetic field flux densities is a circuit configuration 200. In one example, the circuit configuration 200 includes at least two vertical Hall elements (e.g., a Hall element 202a and a Hall element 202b) and a conduction path 204. In one example, the conduction path 204 carries the calibration current 126 (FIG. 1) and generates a first magnetic field flux density $B_1$ along the first Hall element 202a and a second magnetic field flux density $B_2$ along the second Hall element 202b.

Each Hall element 202a, 202b includes at least five metal contacts. For example, the Hall element 202a includes a contact 206, a contact 208, a contact 210, a contact 212 and a contact 214, and the Hall element 202b includes a contact 216, a contact 218, a contact 220, a contact 222 and a contact 224.

The contacts 206, 214 are used to supply power to the Hall element 202a. The contacts 208, 212 are used to measure signals (e.g., a voltage signal) from the Hall element 202a and the contact 210 provides a ground to the Hall element 202a.

The contacts 216, 224 are used to supply power to the Hall element 202b. The contacts 218, 222 are used to measure signals (e.g., a voltage signal) from the Hall element 202b and the contact 220 provides a ground to the Hall element 202b.

The conduction path 204 is separated from the Hall plates 202a, 202b by a distance D. In one example, the distance D is 1 micron.

The magnetic field flux density generated by the calibration current is:

$$B_{cal} = \frac{1}{r} * \frac{\mu}{2\pi} * I_{cal}.$$

Assuming a 1 micron distance between the Hall element and the conduction path and a 10 mA conduction current, the expected magnetic flux density is 20G and the coupling factor is $$\frac{B_{cal}}{I_{cal}} \text{ or } 2 \text{ G/mA.}$$

Figure 3:
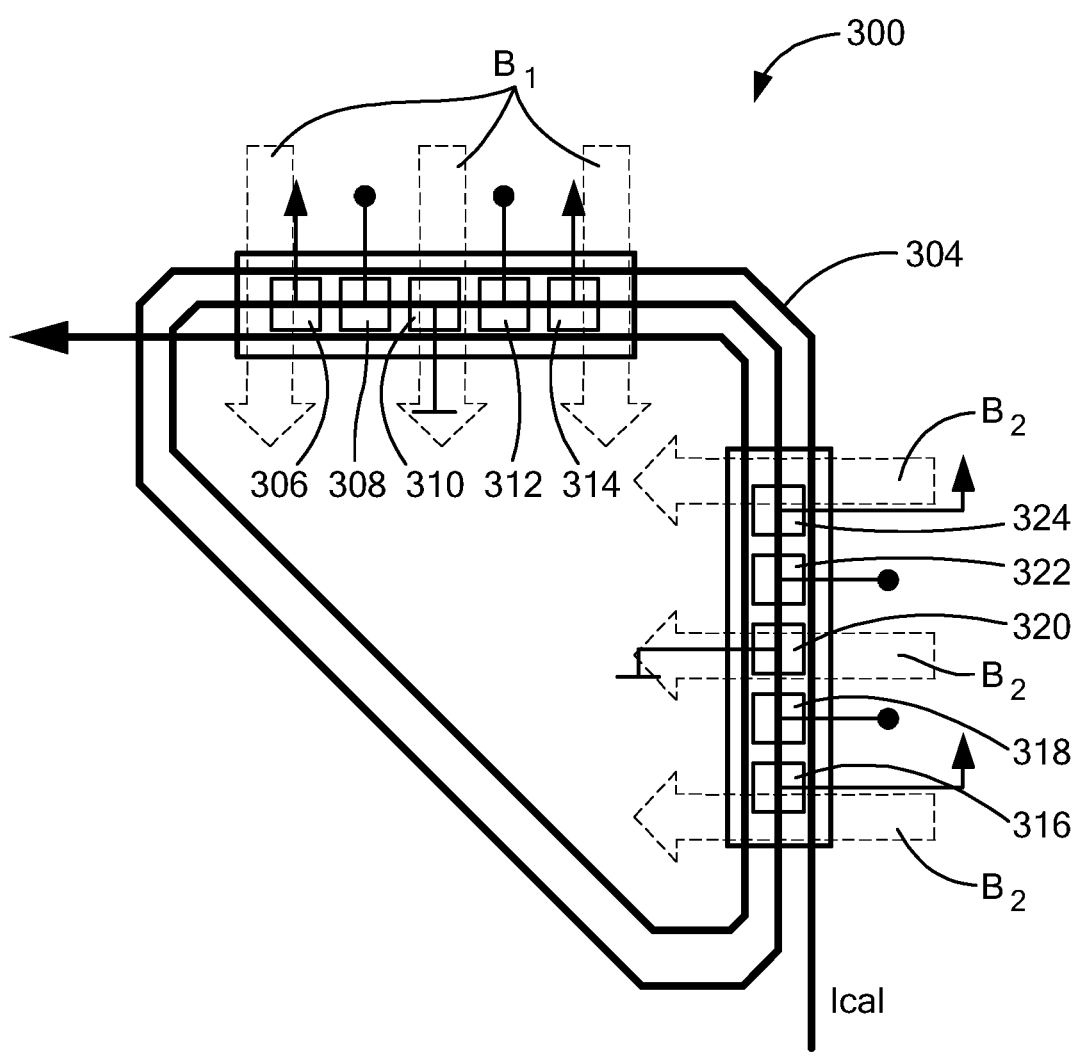
FIG. 3 is a diagram of planar Hall elements with a conduction path arranged in a coil used to generate magnetic field flux densities.

Referring to FIG. 3, another example of a circuit configuration to generate magnetic field flux densities is a circuit configuration 300. In one example, the circuit configuration 200 includes at least two planar Hall elements (e.g., a Hall element 302a and a Hall element 302b) and a conduction path 304 in a form of a coil. In one example, the conduction path 204 carries the calibration current 126 (FIG. 1) and generates a first magnetic field flux density $B_1$ along the first Hall element 302a and a second magnetic field flux density $B_2$ along the second Hall element 302b.

Each Hall element 302a, 302b includes at least five metal contacts. For example, the Hall element 302a includes a contact 306, a contact 308, a contact 310, a contact 312 and a contact 314, and the Hall element 302b includes a contact 316, a contact 318, a contact 320, a contact 322 and a contact 324.

The contacts 306, 314 are used to supply power to the Hall element 302a. The contacts 308, 312 are used to measure voltage from the Hall element 302a and the contact 210 provides a ground to the Hall element 302a.

The contacts 316, 324 are used to supply power to the Hall element 302b. The contacts 318, 322 are used to measure voltage from the Hall element 302b and contact 320 provides a ground to the Hall element 302b.

While FIGS. 2A, 2B and 3 show Hall elements with a single conduction path, in other embodiments, one or more Hall elements may have a separate conduction path from the other Hall elements and thereby have their own respective calibration current. In one example, each Hall elements has a separate conduction path from the other Hall elements. Each conduction path may have a separate or the same current source to generate the respective calibration current. In one example, the current sources that generate the respective calibration currents are current mirrors. In one example, the respective calibration currents are equal.

Figure 4:
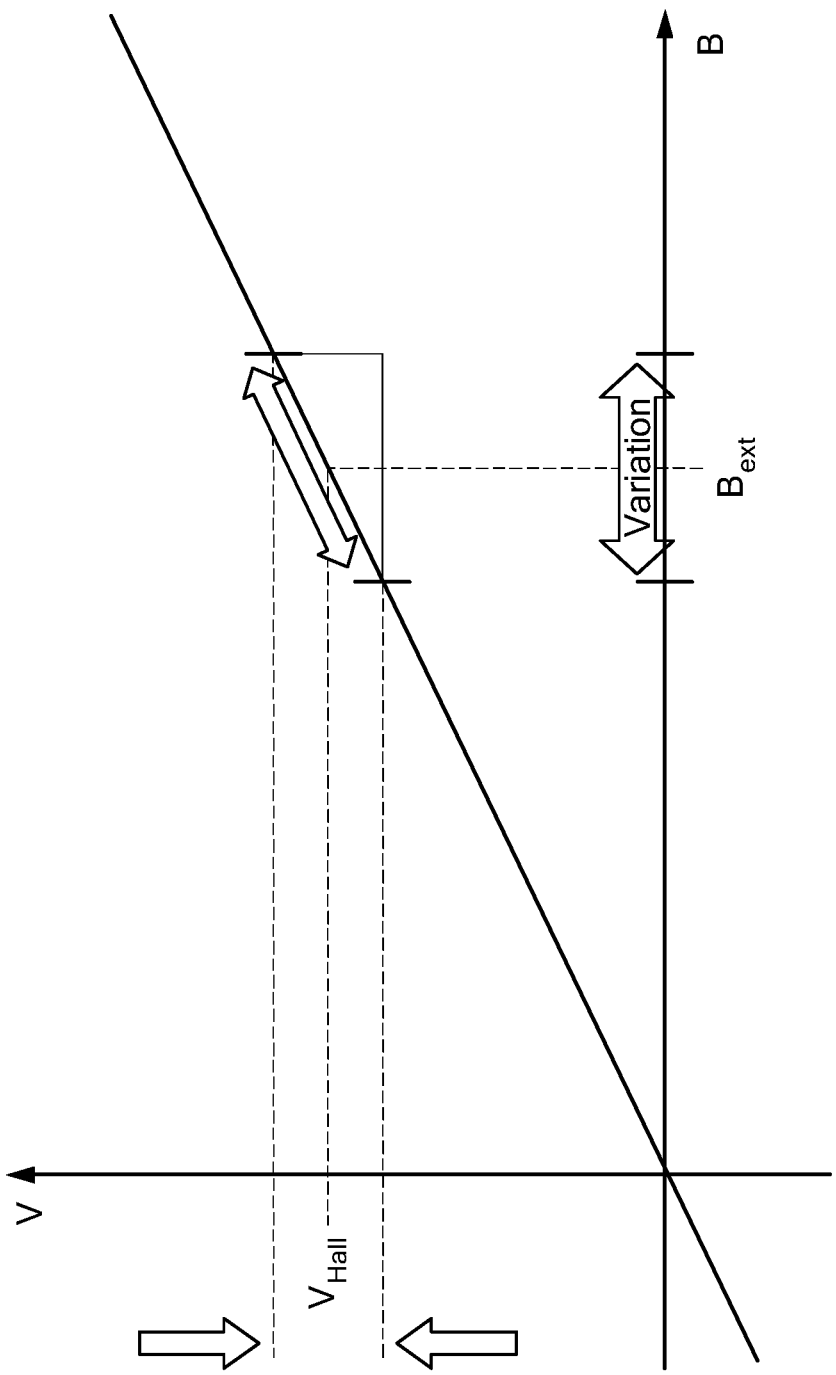
FIG. 4 is a graph a magnetic field versus Hall voltage.

Referring to FIG. 4, typically a magnetic sensor detects magnetic flux densities between 100 Gauss (G) to 1,000 G. Therefore, applying 20G may vary the measured magnetic flux density by roughly 2% to 20%. If the calibration current $I_{cal}$ 126 (FIG. 1) is bidirectional, + or −20G may be achieved doubling the signal variation. Using calibration currents with frequencies higher than a sampling frequency (e.g., >100 kHz) enables a measurement of the Hall element sensitivity, which is equal to a slope in FIG. 4 and shows Hall voltage with respect to magnetic field flux density. For example, the sensitivity of a first Hall element is:

$$sensitivity_{He1} = \frac{\Delta V_{Hall1}}{\Delta B_{ext}},$$

and the sensitivity of a second Hall element is:

$$sensitivity_{He2} = \frac{\Delta V_{Hall2}}{\Delta B_{ext}},$$

and a sensitivity mismatch is:

$$sensitivity_{mismatch} = \frac{sensitivity_{He2}}{sensitivity_{He1}} = \frac{\Delta V_{Hall2}}{\Delta V_{Hall1}},$$

where $\Delta V_{Hall\,1}$ is the change in voltage of the first Hall element, $\Delta V_{Hall\,2}$ is the change in voltage of the second Hall element, and $\Delta B_{ext}$ is the change in magnetic field flux density.

Variances in the measured sensitivity causing a sensitivity mismatch lead to harmonic errors. By compensating the sensitivity mismatch by a change in the Hall element biasing current and/or a mathematical factor in angle processing, the angle accuracy may be improved.

Figure 5A:
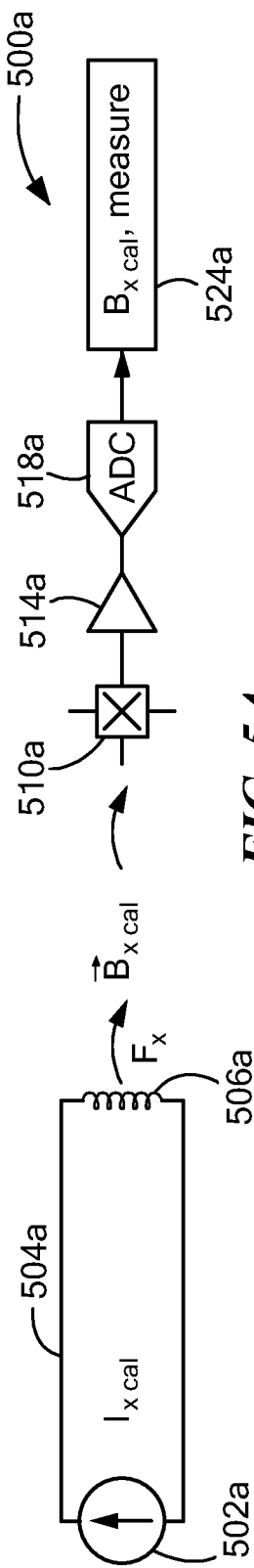
FIGS. 5A to 5C are circuit diagrams used to generate compensation signals.
Figure 5B:
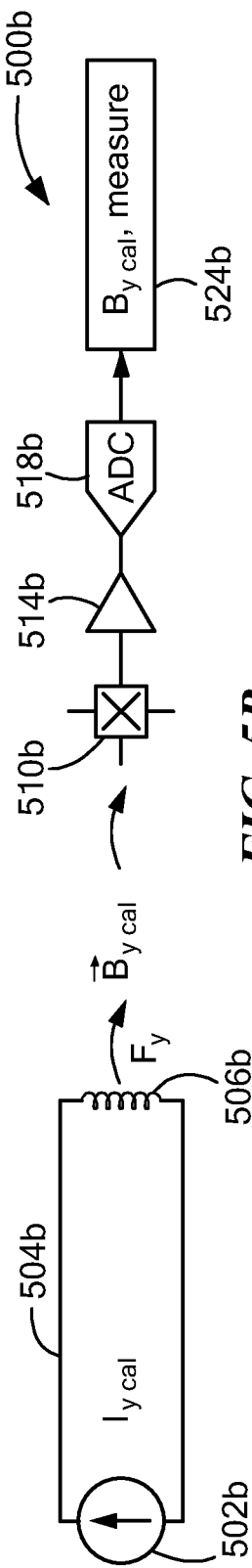
Figure 5C:
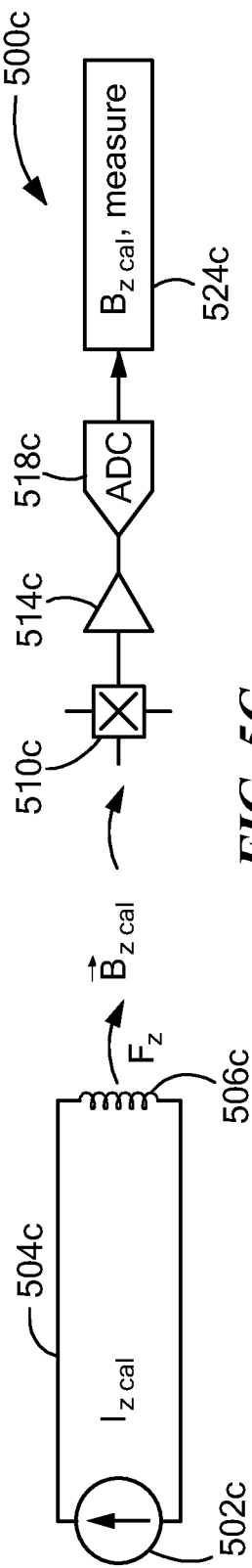

Referring to FIGS. 5A to 5C, examples of circuits to generate compensation signals are circuits 500a, 500b, 500c. The circuits 500a-500c determine compensations signal 524a, 524b, 524c, which are in one embodiment, examples of compensation signals 128.

In one example, the circuit 500a provides a compensation signal in the x-direction. The circuit 500a includes a current source 502a that provides a calibration current $I_{x\ cal}$ on a conduction path 504a to a coil 506a. The coil 506a generates a magnetic flux density $B_{x\ cal}$ that is detected by a Hall element 510a that is aligned along an x-axis. The coupling factor $F_x$ is equal to $B_{x\ cal}/I_{x\ cal}$.

The output signal of the Hall element 510a is amplified by an amplifier 514a and converted from an analog signal to a digital signal by an analog-to-digital converter (ADC) 518a. The digital signal is a calibration signal 524a and represented as $B_{x\ cal,\ measure}$.

In one example, the circuit 500b provides a compensation signal in the y-direction. The circuit 500b includes a current source 502b that provides a calibration current $I_{y\ cal}$ on a conduction path 504b to a coil 506b. The coil 506b generates a magnetic flux density $B_{y\ cal}$ that is detected by a Hall element 510b that is aligned along a y-axis. The coupling factor $F_y$ is equal to $B_{y\ cal}/I_{y\ cal}$.

The output signal of the Hall element 510b is amplified by an amplifier 514b and converted from an analog signal to a digital signal by an ADC 518b. The digital signal is a calibration signal 524b and represented as $B_{y\ cal,\ measure}$.

In one example, the circuit 500c provides a compensation signal in the c-direction. The circuit 500c includes a current source 502c that provides a calibration current $I_{y\ cal}$ on a conduction path 504c to a coil 506c. The coil 506c generates a magnetic flux density $B_{z\ cal}$ that is detected by a Hall element 510c that is aligned along a z-axis. The coupling factor $F_z$ is equal to $B_{z\ cal}/I_{z\ cal}$.

The output signal of the Hall element 510c is amplified by an amplifier 514c and converted from an analog signal to a digital signal by an ADC 518c. The digital signal is a calibration signal 524c and represented as $B_{z\ cal,\ measure}$.

In one embodiment, the current sources 502a-502c are the same current source. In other embodiments, the current sources 502a-502c are current mirrors.

Figure 6A:
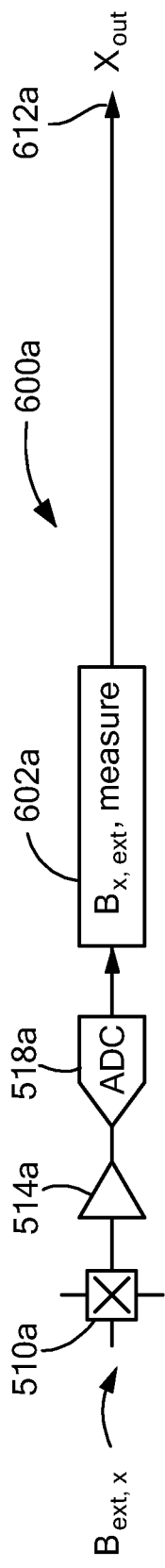
FIGS. 6A to 6C are circuit diagrams to calibrate signals measured from Hall elements using the compensation signals from FIGS. 5A to 5C.
Figure 6B:
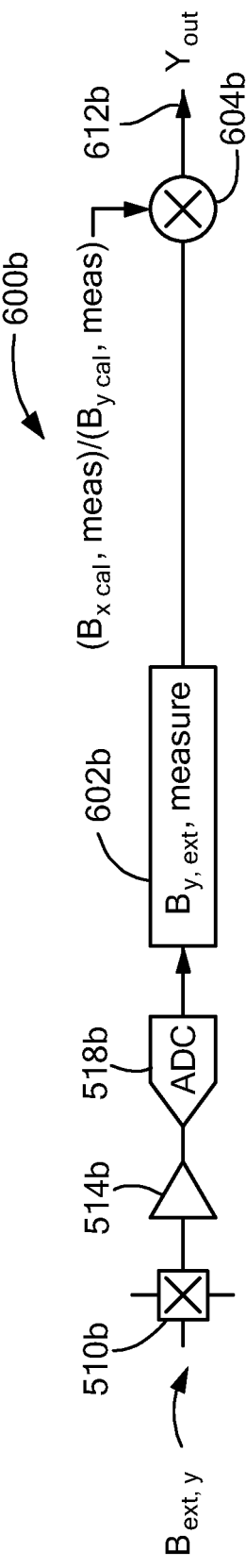
Figure 6C:
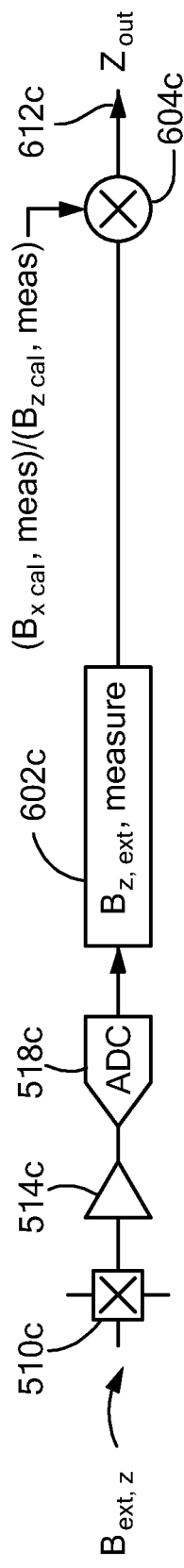

Referring to FIGS. 6A to 6C, examples of circuits to calibrate signals measured from Hall elements using the compensation signals are circuits 600a, 600b, 600c. The circuits 600a-600c determine adjusted signals 612a, 612b, 612c, which are signals that have been calibrated using the compensation signals 524a-524c.

In one example, the circuit 600a provides the adjusted signal 612a in the x-direction. The circuit 600a includes the Hall element 510a, which receives a detected magnetic field, $B_{ext,x}$. The output signal of the Hall element 510a is amplified by the amplifier 514a and converted from an analog signal to a digital signal 602a by the ADC 518a. The digital signal 602a is represented as $B_{x\ ext,\ measure}$.

In this embodiment, the digital signal 602a is the adjusted signal 612a. In this embodiment, the Hall elements 510b, 510c that are aligned along the y-axis and the z-axis are calibrated with the Hall element 510a along the x-axis. In other embodiments, the Hall elements may calibrate to the Hall element along the y-axis or the z-axis. In other embodiments, two Hall elements may be calibrated to each other. In still further embodiments, the Hall elements may be calibrated to a low drift current source.

In one example, the circuit 600b provides the adjusted signal 612b in the y-direction. The circuit 600b includes the Hall element 510b, which receives a detected magnetic field, $B_{ext,y}$. The output signal of the Hall element 510b is amplified by the amplifier 514b and converted from an analog signal to a digital signal 602b by the ADC 518b. The digital signal 602b is represented as $B_{y\ ext,\ measure}$. The digital signal 602b is provided to a mixer 604b to be mixed with the compensation signal 524a, 524b. That is, the ratio of the compensation signal 524b to the compensation signals 524c ($B_{x\ cal,\ measure}/B_{y\ cal,\ measure}$) is mixed with the signal 602b to provide an adjusted signal 612b.

In one example, the circuit 600c provides the adjusted signal 612c in the z-direction. The circuit 600c includes the Hall element 510c, which receives a detected magnetic field, $B_{ext,z}$. The output signal of the Hall element 510c is amplified by the amplifier 514c and converted from an analog signal to a digital signal 602c by the ADC 518c. The digital signal 602c is represented as $B_{z\ ext,\ measure}$. The digital signal 602c is provided to a mixer 604c to be mixed with the compensation signals 524a, 524c. That is, the ratio of the compensation signal 524b to the compensation signal 524c ($B_{x\ cal,\ measure}/B_{z\ cal,\ measure}$) is mixed with the signal 602c to provide an adjusted signal 612c.

Figure 7:
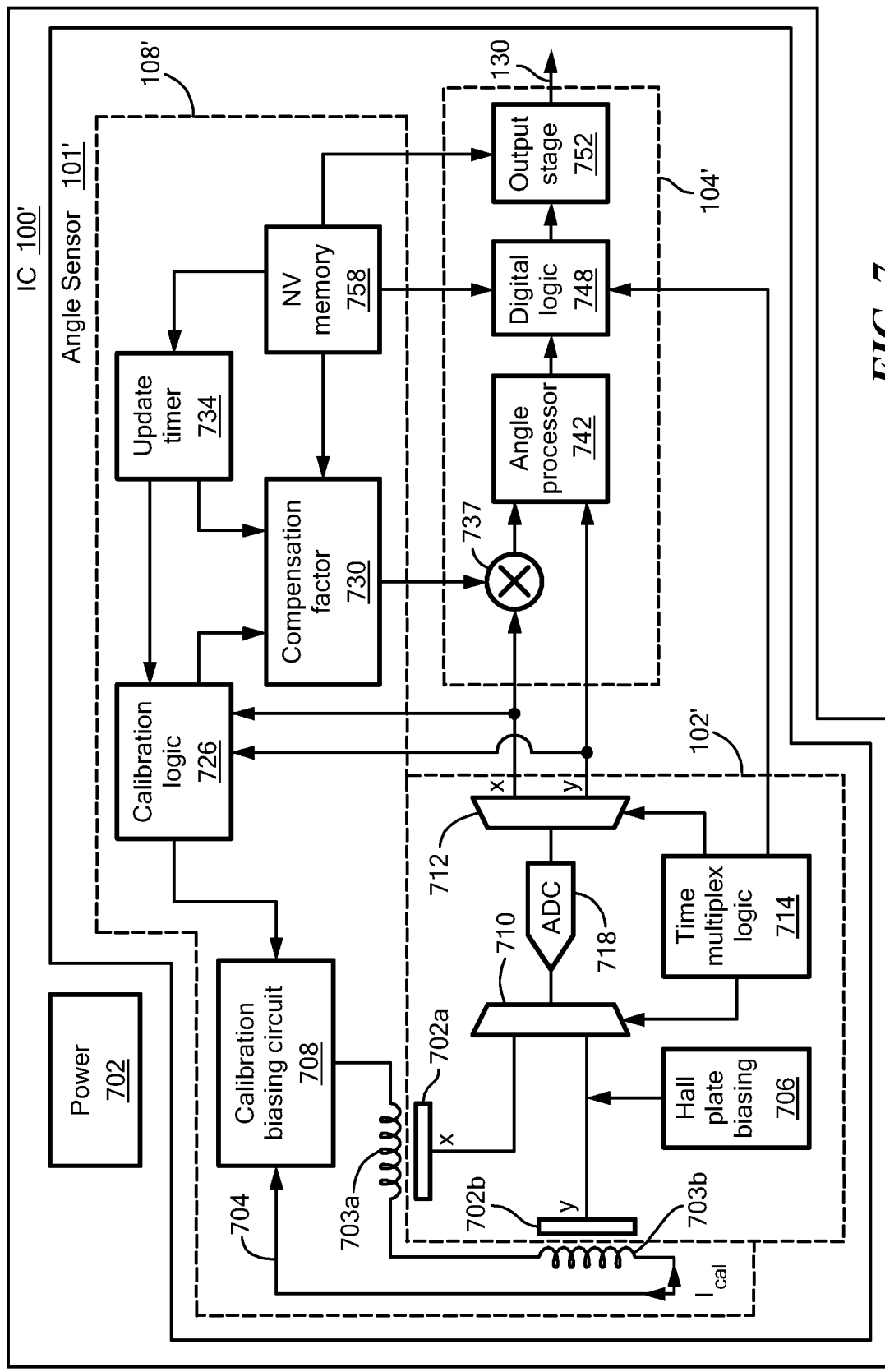
FIG. 7 is a block diagram of an example of a circuit used to calibrate signals from Hall elements.

Referring to FIG. 7, an example of the IC 100 (FIG. 1) to calibrate signals from the Hall elements is an IC 100'. The IC 100' includes an angle sensor 101', which is an example of the angle sensor 101 (FIG. 1), and power 702 which powers the IC 100'.

The Hall elements 102' includes Hall elements 102', which are similar to Hall elements 102 (FIG. 1); angle processing circuitry 104', which is similar to angle processing circuitry 104 (FIG. 1), and calibration circuitry 108', which is similar to calibration circuitry 108 (FIG. 1).

The angle sensor 101' includes a Hall element 702a aligned along the x-axis and a Hall element 702b aligned along the y-axis. The Hall elements 702a, 702b are biased by the Hall plate biasing 706.

The calibration circuitry 108' includes a calibration biasing circuit 708, which supplies the calibration current $I_{cal}$ on the conduction path 704 to generate magnetic field flux densities at the coils 702a, 702b adjacent to their respective Hall element 702a, 702b.

Each Hall element 702a, 702b provides a signal to a multiplexor 710 which is controlled by time multiplexor logic 714. The signals from the multiplexor are converted by an ADC 718 from analog to digital and sent to a multiplexor 712 controlled by the time multiplexor logic 714.

The calibration circuitry 108' also includes calibration logic 726. The signals from the multiplexor 712 are sent to the calibration logic 726 to determine the compensation signals. The compensation signals are sent to compensation factor 730.

In this embodiment, the signals from the Hall plate 702a are calibrated to the Hall plate 702b. Thus, the signals from the Hall plate 702a are mixed by a mixer 737 of the angle processing circuitry 104' with compensation signals from the compensation factor 730 and sent to an angle processor 742 while the signals from the Hall plate 702b are sent directly to the angle processor 742.

In one example, the angle processor 742 is a CORDIC (COordinate Rotation DIgital Computer). The angle processor 742 may perform various trigonometric functions that can be used to compute an angle of magnetic field. In one example, the angle processor 742 performs a function, α tan 2 (P1, P2) to determine α, the angle of the direction of the magnetic-field vector, where P1 and P2 are parameters. In one example, P1 may represent signals from the Hall element 702b and P2 represents signals from the Hall element 702a.

The angle determined by the angle processor 742 is sent to digital logic 748 and to an output stage 752. The update timer 734 is used to control the calibration logic and the compensation factor 730 to update the calibration signals on a regular basis.

The compensation circuitry 108' also includes a non-volatile (NV) memory 758. In one example, the NV memory 758 stores parameters to control the update timer 734, the compensation factor 730, the digital logic 748 and the output stage 752.

In some examples, the NV memory 758 store time adjustment factors and amplitude adjustment factors (PID regulator logic) for the compensation block 730 and the update timer block 734 in order to control the speed in which the compensation factor is being adjusted.

In some examples, the NV memory 758 may be used to control the digital logic 748 to adjust the angle output to fit application requirements (e.g., adjust zero angle point, adjust angle gain, adjust angle saturation and so forth).

In some examples, the NV memory 758 may be used to store configuration values for the output stage 752, so that different interfaces may be used (e.g., SENT, PWM with various tick times, frequencies and so forth).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An angle sensor comprising:
   a first Hall element disposed on a first axis;
   a second Hall element disposed on a second axis perpendicular to the first axis;
   a conduction path having a first portion extending parallel to the first axis and a second portion parallel to the second axis, wherein the conduction path is not in contact with the first or second Hall elements, wherein the conduction path is configured to conduct a calibration current that generates a first magnetic flux density measured at the first Hall element and a second magnetic flux density measured at the second Hall element; and
   calibration circuitry configured to:
      generate one or more compensation signals based on the first and second magnetic flux densities; and
      adjust an external magnetic flux density measured at the second Hall element due to an external magnetic field using the one or more compensation signals to reduce angle error of the angle sensor.

2. The angle sensor of claim 1, wherein the first and second Hall elements are vertical Hall elements.

3. The angle sensor of claim 1, wherein the calibration current is 10 milliamps.

4. The angle sensor of claim 1, wherein the first and second Hall elements are planar Hall elements.

5. The angle sensor of claim 4, wherein the conduction path is a coil.

6. The angle sensor of claim 1, wherein the calibration current is an alternating current.

7. The angle sensor of claim 6, wherein a frequency of the calibration current is 100 kHz.

8. The angle sensor of claim 1, wherein the conduction path is spaced apart from the first Hall element by about one micron.

9. The angle sensor of claim 8, wherein the conduction path is spaced apart from the second Hall element by about one micron.

10. An angle sensor comprising:
    a first Hall element disposed on a first axis;
    a second Hall element disposed on a second axis perpendicular to the first axis;
    a third Hall element disposed on a third axis, the third axis being perpendicular to the first axis and being perpendicular to the second axis;
    a conduction path having a first portion extending parallel to the first axis and a second portion parallel to the second axis, wherein the conduction path is configured to conduct a calibration current that generates a first magnetic flux density measured at the first Hall element and a second magnetic flux density measured at the second Hall element; and
    calibration circuitry configured to:
       generate one or more compensation signals based on the first and second magnetic flux densities; and
       adjust an external magnetic flux density measured at the second Hall element due to an external magnetic field using the one or more compensation signals to reduce angle error of the angle sensor,
    wherein the conduction path has a third portion extending parallel to the third axis.

11. The angle sensor of claim 10, wherein the calibration current generates a third magnetic flux density measured at the third Hall element;
    wherein the calibration circuitry is further configured to:
       generate the one or more compensation signals based on the third magnetic flux density; and
       adjust the magnetic flux measured at the third Hall element from an external magnetic field using the one or more compensation signals.

12. The angle sensor of claim 10, wherein the conduction path is not in contact with the first, second or third Hall elements.

13. The angle sensor of claim 10, wherein the first and second Hall elements are vertical Hall elements or planar Hall elements.

14. A method comprising:
    generating a first magnetic flux density and/or a second magnetic flux density using a calibration current on a conduction path;
    determining one or more compensation signals based on the first magnetic flux density measured at a first Hall element of an angle sensor disposed on a first axis and the second magnetic flux density measured at a second Hall element of the angle sensor disposed on a second axis perpendicular to the first axis;
    separating the conduction path from the first and/or second Hall element by a distance; and
    adjusting an external magnetic flux density measured at the second Hall element due to an external magnetic field using the one or more compensation signals.

15. The method of claim 14, wherein separating the conduction path from the first and/or second Hall element by a distance comprises spacing the conduction path about 1 micron from the first Hall element.

16. The method of claim 15, wherein separating the conduction path from the first and/or second Hall element by a distance comprises spacing the conduction path about 1 micron from the second Hall element.

17. A method comprising:
    determining one or more compensation signals based on a first magnetic flux density measured at a first Hall element of an angle sensor disposed on a first axis and a second magnetic flux density measured at a second Hall element of the angle sensor disposed on a second axis perpendicular to the first axis; and adjusting an external magnetic flux density measured at the second Hall element due to an external magnetic field using the one or more compensation signals; and determining one or more compensation signals based on a first magnetic flux density, a second magnetic flux density and a magnetic flux density measured at a third Hall element orthogonal to a first and second Hall elements.

18. The method of claim 17, further comprising adjusting an external magnetic flux density measured at the third Hall element due to the external magnetic field using the one or more compensation signals.

19. The method of claim 17, further comprising applying a calibration current to a first conduction path that generates the first magnetic flux density.

20. The method of claim 19, further comprising applying a calibration current to a second conduction path that generates the second magnetic flux density.

21. The method of claim 20, wherein the first conduction path is equal to the second conduction path.

22. An angle sensor comprising:
a first Hall element disposed on a first axis;
a second Hall element disposed on a second axis perpendicular to the first axis;
a first conduction path extending parallel to the first axis, wherein the first conduction path is configured to conduct a first calibration current that generates a first magnetic flux density measured at the first Hall, wherein the first conduction path is not in contact with the first Hall element;
a second conduction path extending parallel to the second axis, wherein the second conduction path is configured to conduct a second calibration current that generates a second magnetic flux density measured at the second Hall element, wherein the second conduction path is not in contact with the second Hall element; and
calibration circuitry configured to:
generate one or more compensation signals based on the first and second magnetic flux densities; and
adjust an external magnetic flux density measured at the second Hall element due to an external magnetic field using the one or more compensation signals to reduce angle error of the angle sensor.

23. The angle sensor of claim 22, wherein the first conduction path is spaced apart from the first Hall element by about one micron; and
wherein the second conduction path is spaced apart from the second Hall element by about one micron.

24. The angle sensor of claim 22, wherein the first and second calibration currents are equal.

25. The angle sensor of claim 22, wherein the first and second Hall elements are vertical Hall elements or planar Hall elements.

26. The angle sensor of claim 22, wherein each of the first and second calibration currents is an alternating current.

27. The angle sensor of claim 26, wherein a frequency of each of the first and second calibration currents is 100 kHz.

28. An angle sensor comprising:
a first Hall element disposed on a first axis;
a second Hall element disposed on a second axis perpendicular to the first axis;
a third Hall element disposed on a third axis, the third axis being perpendicular to the first axis and being perpendicular to the second axis;
a first conduction path extending parallel to the first axis, wherein the first conduction path is configured to conduct a first calibration current that generates a first magnetic flux density measured at the first Hall;
a second conduction path extending parallel to the second axis, wherein the second conduction path is configured to conduct a second calibration current that generates a second magnetic flux density measured at the second Hall element;
a third conduction path parallel to the third axis,
wherein the third conduction path conducts a third calibration current that generates a third magnetic flux density measured at the third Hall element;
wherein the calibration circuitry is configured to:
generate one or more compensation signals based on the first and second magnetic flux densities;
adjust an external magnetic flux density measured at the second Hall element due to an external magnetic field using the one or more compensation signals to reduce angle error of the angle sensor;
generate the one or more compensation signals based on the third magnetic flux density; and
adjust the magnetic flux measured at the third Hall element from an external magnetic field using the one or more compensation signals.

29. The angle sensor of claim 28, wherein the first, second, and third Hall elements are vertical Hall elements or planar Hall elements.

30. The angle sensor of claim 28, wherein the first, second and third calibration currents are equal.

31. The angle sensor of claim 28, wherein the first conduction path is not in contact with the first Hall element,
wherein the second conduction path is not in contact with the second Hall element, and
wherein the third conduction path is not in contact with the third Hall element.

32. The angle sensor of claim 28, wherein each of the first, second and third calibration currents is an alternating current.

33. The angle sensor of claim 32, wherein a frequency of each of the first, second and third calibration currents is 100 kHz.

* * * * *

UNITED STATES PATENT AND TRADEMARK OFFICE
CERTIFICATE OF CORRECTION

PATENT NO. : 11,169,223 B2
APPLICATION NO. : 16/826451
DATED : November 9, 2021
INVENTOR(S) : Till-Jonas Ostermann et al.

It is certified that error appears in the above-identified patent and that said Letters Patent is hereby corrected as shown below:

On the Title Page

(73) Assignee delete "Manchester, MA (US)" and replace with --Manchester, NH (US)--.

In the Specification

Column 1, Line 54 delete "Hall and" and replace with --Hall element and--.

Column 2, Line 16 delete "graph a" and replace with --graph of a--.

Column 2, Line 34 delete "element" and replace with --a Hall--.

Column 2, Line 55 delete "Y122" and replace with --Y124--.

Column 2, Line 62 delete "elements 101." and replace with --elements 102.--.

Column 3, Line 36 delete "plates" and replace with --elements--.

Column 3, Line 59 delete "200" and replace with --300--.

Column 3, Line 62 delete "204" and replace with --304--.

Column 4, Line 7 delete "210" and replace with --310--.

Column 4, Line 17 delete "elements" and replace with --element--.

Column 4, Line 65 delete "compensations signal" and replace with --compensation signals--.

Column 6, Line 1 delete "signal" and replace with --signals--.

Signed and Sealed this
Tenth Day of January, 2023

*Katherine Kelly Vidal*
Katherine Kelly Vidal
*Director of the United States Patent and Trademark Office*

Column 6, Line 2 delete "signals" and replace with --signal--.

Column 6, Line 35 delete "element" and replace with --elements--.

Column 6, Line 57 delete ", α tan" and replace with --, atan2--.

Column 7, Line 6 delete "store" and replace with --stores--.